United States Patent [19]
Traynor et al.

[11] Patent Number: 5,272,453
[45] Date of Patent: Dec. 21, 1993

[54] METHOD AND APPARATUS FOR SWITCHING BETWEEN GAIN CURVES OF A VOLTAGE CONTROLLED OSCILLATOR

[75] Inventors: Kevin M. Traynor; Hengwei Hsu; Kenneth R. Burch, all of Austin, Tex.

[73] Assignee: Motorola Inc., Schaumburg, Ill.

[21] Appl. No.: 923,767

[22] Filed: Aug. 3, 1992

[51] Int. Cl.$^5$ .................. H03B 5/02; H03L 7/099
[52] U.S. Cl. ................................. 331/57; 331/17; 331/25; 331/34; 331/108 A; 331/108 B; 331/177 R; 331/179
[58] Field of Search ............. 331/17, 25, 34, 57, 331/108 A, 108 B, 177 R, 179

[56] References Cited

U.S. PATENT DOCUMENTS

| | | | |
|---|---|---|---|
| 4,494,080 | 1/1985 | Call | 331/177 R X |
| 4,853,654 | 8/1989 | Sakurai | 331/57 |
| 4,931,748 | 6/1990 | McDermott et al. | 331/1 A |
| 4,965,535 | 10/1990 | Neuman | 331/179 X |
| 4,988,960 | 1/1991 | Tomisawa | 331/57 X |

FOREIGN PATENT DOCUMENTS 0171022 12/1986 European Pat. Off.
59-86326 5/1984 Japan.

OTHER PUBLICATIONS

Mihai Banu; MOS Oscillators with Multi-Decade Tuning Range and Gigahertz Maximum Speed; IEEE Journal of Solid-State Circuits, vol. 23, No. 6, Dec. 1988; pp. 1386-1393.

Mihai Banu; Session I: High-Speed Data Recovery--WAM 1.5: 100 KHz-1 GHz NMOS Variable-Frequency Oscillator with Analog and Digital Control; 1988 IEEE International Solid State Circuits Conference, Feb. 17, 1988; pp. 20-22.

Primary Examiner—Siegfried H. Grimm
Attorney, Agent, or Firm—Susan C. Hill

[57] ABSTRACT

A method and apparatus for switching between gain curves of a switched gain voltage controlled oscillator (VCO) 52, 52′ or 52″. In one form, the present invention uses a switched gain voltage controlled oscillator (VCO) 52, 52′ or 52″ which utilizes a ring oscillator. A Gain Control signal is used to select between using a high gain curve and using a low gain curve. The low gain curve is produced by selecting a high resistance path to either power or ground. The high gain curve is produced by selecting a low resistance path to either power or ground.

20 Claims, 7 Drawing Sheets

METHOD AND APPARATUS FOR SWITCHING BETWEEN GAIN CURVES OF A VOLTAGE CONTROLLED OSCILLATOR

FIELD OF THE INVENTION

The present invention relates in general to a voltage controlled oscillator, and more particularly to switching between gain curves of a voltage controlled oscillator.

BACKGROUND OF THE INVENTION

Some microcomputer integrated circuits have a voltage controlled oscillator (VCO) on the integrated circuit. Usually the VCO is part of a phase lock loop circuit. The purpose of the phase lock loop circuit is to generate a high frequency signal that is approximately in phase with a much lower frequency crystal oscillator signal. The high frequency signal is then used to generate internal clock signals which are used to clock various circuitry on the microcomputer. The use of the phase lock loop circuit allows an inexpensive low frequency crystal (e.g. 32 KHz) to be used even when the internal clock signal frequency is much higher (e.g. 16 MHz). The phase lock loop circuit functions by phase locking the VCO output signal with the incoming crystal oscillator signal.

In some microcomputers, the VCO also serves the additional purpose of generating a free running clock to keep the microcomputer functioning when the crystal oscillator fails. Some microcomputers, such as Motorola's 68300 family of microcomputers (e.g.: XC68340, MC68332, XC68331, and XC68330 all available from Motorola, Inc. of Austin, Tex.), have a special "Limp Mode" which is used in case the crystal oscillator fails. If the crystal oscillator fails, i.e. stops oscillating, the phase lock loop circuit would normally force the VCO output signal to also stop oscillating. Unfortunately this would cause the internal clock signals to stop oscillating, and thus the microcomputer would stop functioning.

Having the microcomputer stop functioning due to a failure of the crystal oscillator is unacceptable to some microcomputer customers. Thus Limp Mode may be used by these customers to continue operation when the crystal oscillator fails. In Limp Mode, the VCO output signal is no longer phase locked to the malfunctioning crystal oscillator signal. Instead, the VCO output signal is allowed to continue oscillating as a free running clock. The term "free running" indicates that the VCO is no longer phase locked to the crystal oscillator signal. The VCO on Motorola's 68300 family of microcomputers thus has two possible modes: (1) a standard Phase Lock Loop Mode; and (2) a special Limp Mode.

The "gain curve" of a VCO is a very important characteristic of the VCO. The gain curve is a plot of the frequency of the VCO output signal (vertical axis) versus the input bias voltage (horizontal axis). Each point on the gain curve represents the frequency of the VCO (in MHz) for a given input bias voltage (in volts). The gain is also a function of temperature. Generally, as temperature decreases, the gain of the VCO increases. At low operating voltages, the slope of the gain curve will be more stable across temperature; but at higher operating voltages, the slope of the gain curve will vary significantly across temperature.

In the standard Phase Lock Loop Mode, the VCO requires a high gain in order to produce a broad range of VCO output frequencies across temperature, operating voltage, and manufacturing variables, as required by some customer applications. In the special Limp Mode, the VCO requires a lower gain in order to prevent the free running VCO output signal from oscillating at frequencies beyond the maximum operating frequency of the microcomputer.

If the gain of the VCO is too high in special Limp Mode, the VCO output signal may be an excessively high frequency. This excessively high frequency VCO output signal will then be used to generate excessively high frequency internal clock signals. These internal clock signals may be too high of a frequency to properly clock the various circuitry on the microcomputer. Consequently the microcomputer may not function properly if the gain of the VCO is too high in special Limp Mode.

Thus, in the standard Phase Lock Loop Mode, it is desirable for the VCO to have a high gain; and in the special Limp Mode, it is desirable, and in fact necessary, that the VCO have a sufficiently low gain. The previous VCOs on Motorola's 68300 family of microcomputers treated this problem as a trade-off. The gain of the previous VCOs was selected to be somewhere between the desired high gain for Phase Lock Loop Mode and the required lower gain for special Limp Mode.

Under normal operating conditions and temperatures, this trade-off solution was adequate. Unfortunately, however, this trade-off solution was not adequate under the extreme conditions of high voltage and low temperature. At the highest voltage and the lowest temperature, the VCO gain was too high in special Limp Mode and the microcomputer sometimes did not function properly. Also, this trade-off solution resulted in VCO output signal frequencies which covered an excessively broad range.

Because microcomputers may be used in rugged applications, such as automobile engines, most microcomputers must be able to operate across a wide range of temperatures and voltages. For example, Motorola's 68300 family of microcomputers must presently be able to operate across a voltage range of 3.0 to 5.5 volts and across a temperature range of −55 to 125 degrees Celsius. Thus, a solution to the VCO gain problem was needed that would work across the entire specified ranges of temperature and voltage.

SUMMARY OF THE INVENTION

The previously mentioned needs are fulfilled and other advantages achieved with the present invention. In one form, the present invention is a method and apparatus for switching between gain curves of a voltage controlled oscillator.

In one embodiment, the apparatus is a voltage controlled oscillator circuit which has a ring oscillator and a first gain curve circuit which is coupled to the ring oscillator. The first gain curve circuit causes the ring oscillator to have a first gain curve. The apparatus also has a second gain curve circuit which is coupled to the ring oscillator. The second gain curve circuit causes the ring oscillator to have a second gain curve. The apparatus additionally has a gain control signal which is coupled to the first gain curve circuit. The gain control signal enables the first gain curve circuit when the gain control signal is in a first logic state, and the gain control signal enables the second gain curve circuit when the gain control signal is in a second logic state.

The present invention will be understood by one skilled in the art from the detailed description below in conjunction with the accompanying drawings.

DESCRIPTION OF THE PREFERRED EMBODIMENTS

The desired solution is a voltage controlled oscillator (VCO) which has a high gain in the standard Phase Lock Loop Mode, which has a sufficiently low gain in the special Limp Mode, and which continues to function across the entire specified ranges of temperature and voltage. The present invention meets all of these requirements.

The present invention provides a VCO which has two possible gain curves. A control signal, Gain Control, is used by the VCO to determine which gain curve is to be used. In the preferred embodiment, the first gain curve is a high gain curve which is used in the standard Phase Lock Loop Mode, and the second gain curve is a lower gain curve which is used in the special Limp Mode. In the preferred embodiment, a ring oscillator is used to generate the VCO output signal.

By changing the resistance in certain paths to power or ground, the shape of the gain curve of the VCO can be modified. In the preferred embodiment of the present invention, there are two available gain curves because the Gain Control signal can be used to select between a first resistance value in those certain paths and a second resistance value in those certain paths. If the Gain Control signal is used to select the first resistance value, then the frequency of the VCO output signal will follow the first gain curve. And if the Gain Control signal is used to select the second resistance value, then the frequency of the VCO output signal will follow the second gain curve.

The first resistance value can be chosen in order to optimize the shape of the high gain curve for operation in the standard Phase Lock Loop Mode. The second resistance value can be chosen in order to ensure that the gain of the VCO is always low enough for the microcomputer to continue to function properly across the entire specified ranges of temperature and voltage. The present invention thus allows the VCO to be optimized for both high gain Phase Lock Loop Mode and low gain special Limp Mode. In addition, the present invention could be used for other VCO modes which require a different shaped gain curve.

DESCRIPTION OF THE FIGURES

Figure 1:
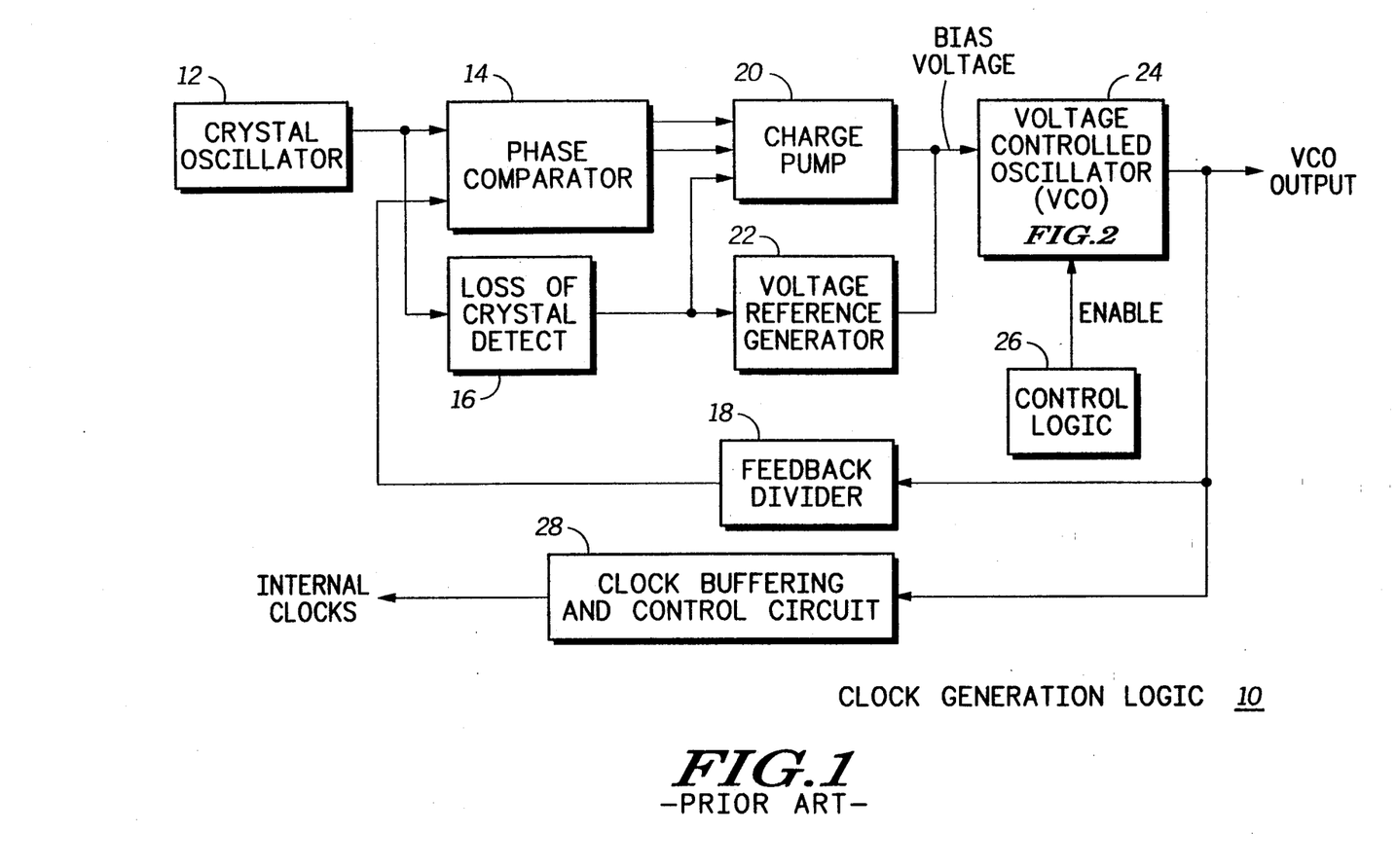
FIG. 1 illustrates, in block diagram form, a prior art clock generation logic circuit 10.

FIG. 1 illustrates a prior art clock generation logic circuit 10. A crystal oscillator circuit 12 provides a signal to both a phase comparator circuit 14 and a loss of crystal detect circuit 16. The phase comparator 14 also receives a signal from a feedback divider circuit 18. Phase comparator 14 provides two signals to a charge pump circuit 20. Loss of crystal detect 16 provides a signal to both a voltage reference generator circuit 22 and to charge pump 20. Both charge pump 20 and voltage reference generator 22 are coupled to a voltage controlled oscillator circuit (VCO) 24 in order to provide a bias voltage.

Although it is not illustrated for the sake of simplicity, control logic circuit 26 is coupled to each block of circuitry illustrated in FIG. 1. However, FIG. 1 does illustrate that control logic 26 provides an Enable signal to VCO 24. VCO 24 provides a VCO Output signal which is an input to a clock buffering and control circuit 28 and to feedback divider 18. Clock buffering and control circuit 28 generates clock signals called Internal Clocks which are used throughout the microcomputer to clock various circuitry.

Figure 2:
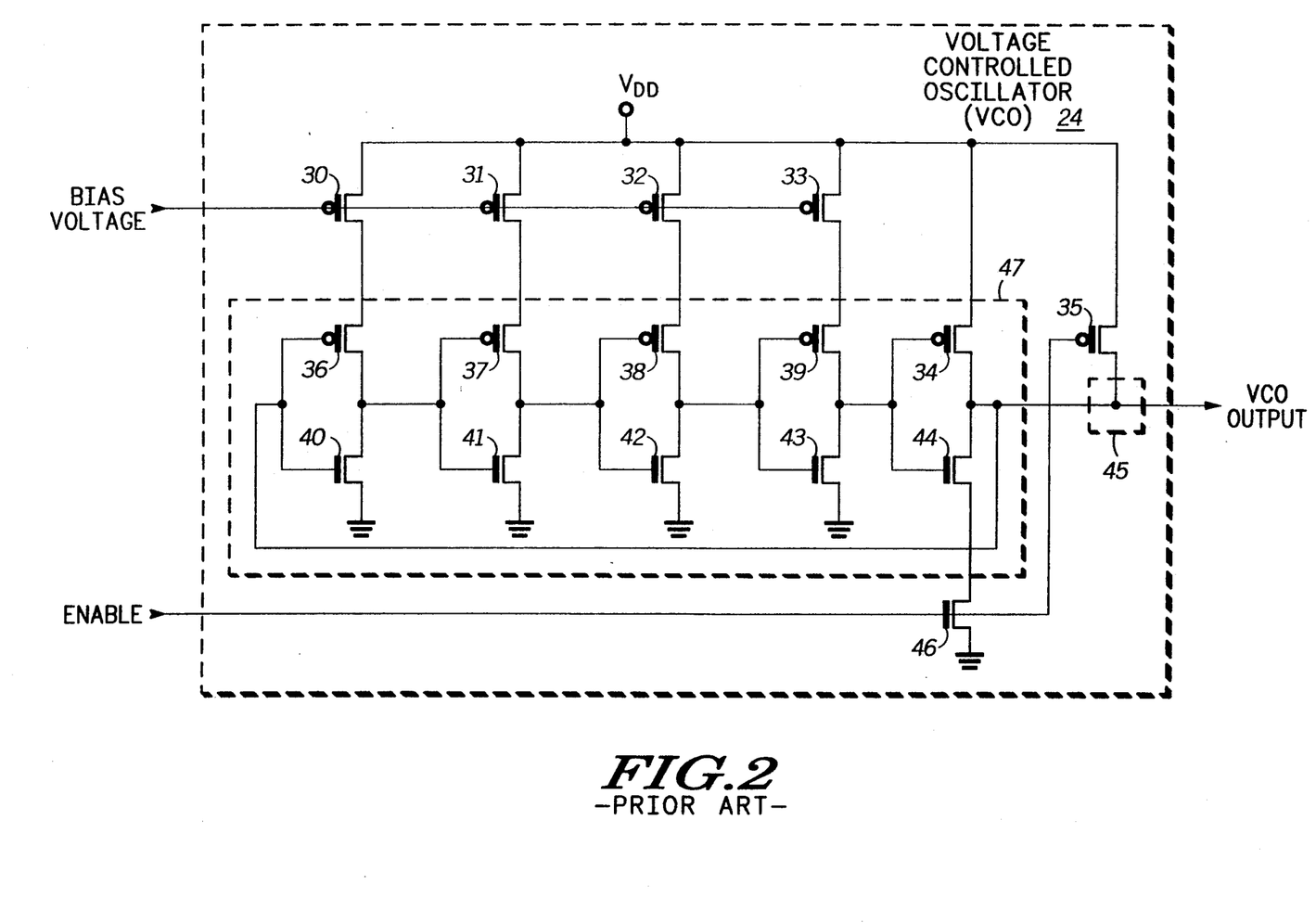
FIG. 2 illustrates, in schematic diagram form, a prior art voltage controlled oscillator circuit 24 of FIG. 1.

FIG. 2 illustrates a prior art voltage controlled oscillator (VCO) circuit 24 of FIG. 1. P-channel CMOS transistors 30-33 each have a first current electrode coupled to a positive power supply voltage labeled VDD, and each have a control electrode coupled to a Bias Voltage. VDD is also coupled to a first current electrode of a p-channel CMOS transistor 34 and to a first current electrode of a p-channel CMOS transistor 35.

The second current electrode of transistor 30 is coupled to a first current electrode of a p-channel CMOS transistor 36. The second current electrode of transistor 31 is coupled to a first current electrode of a p-channel CMOS transistor 37. The second current electrode of transistor 32 is coupled to a first current electrode of a p-channel CMOS transistor 38. The second current electrode of transistor 33 is coupled to a first current electrode of a p-channel CMOS transistor 39.

The second current electrode of transistor 36 is coupled to a first current electrode of an n-channel CMOS transistor 40, to a control electrode of transistor 37, and to a control electrode of an n-channel CMOS transistor 41. The second current electrode of transistor 37 is coupled to a first current electrode of transistor 41, to a control electrode of transistor 38, and to a control electrode of an n-channel CMOS transistor 42. The second current electrode of transistor 38 is coupled to a first current electrode of transistor 42, to a control electrode of transistor 39, and to a control electrode of an n-channel CMOS transistor 43. The second current electrode of transistor 39 is coupled to a first current electrode of transistor 43, to a control electrode of transistor 34, and to a control electrode of an n-channel CMOS transistor 44. The second current electrode of transistor 34 is coupled node 45, to a first current electrode of transistor 44, to a control electrode of transistor 36, to a control electrode of transistor 40, and to a second current electrode of transistor 35.

The second current electrode of transistor 44 is coupled to a first current electrode of an n-channel CMOS transistor 46. An Enable signal is coupled to the control electrodes of transistors 35 and 46. The second current electrode of transistors 40–43 and 46 are all coupled to ground. A VCO Output signal is provided from node 45. Ring oscillator circuit 47 has five stages. Transistors 36 and 40 form the first stage; transistors 37 and 41 form the second stage; transistors 38 and 42 form the third stage; transistors 39 and 43 form the fourth stage; and transistors 34 and 44 form the fifth stage.

Figure 3:
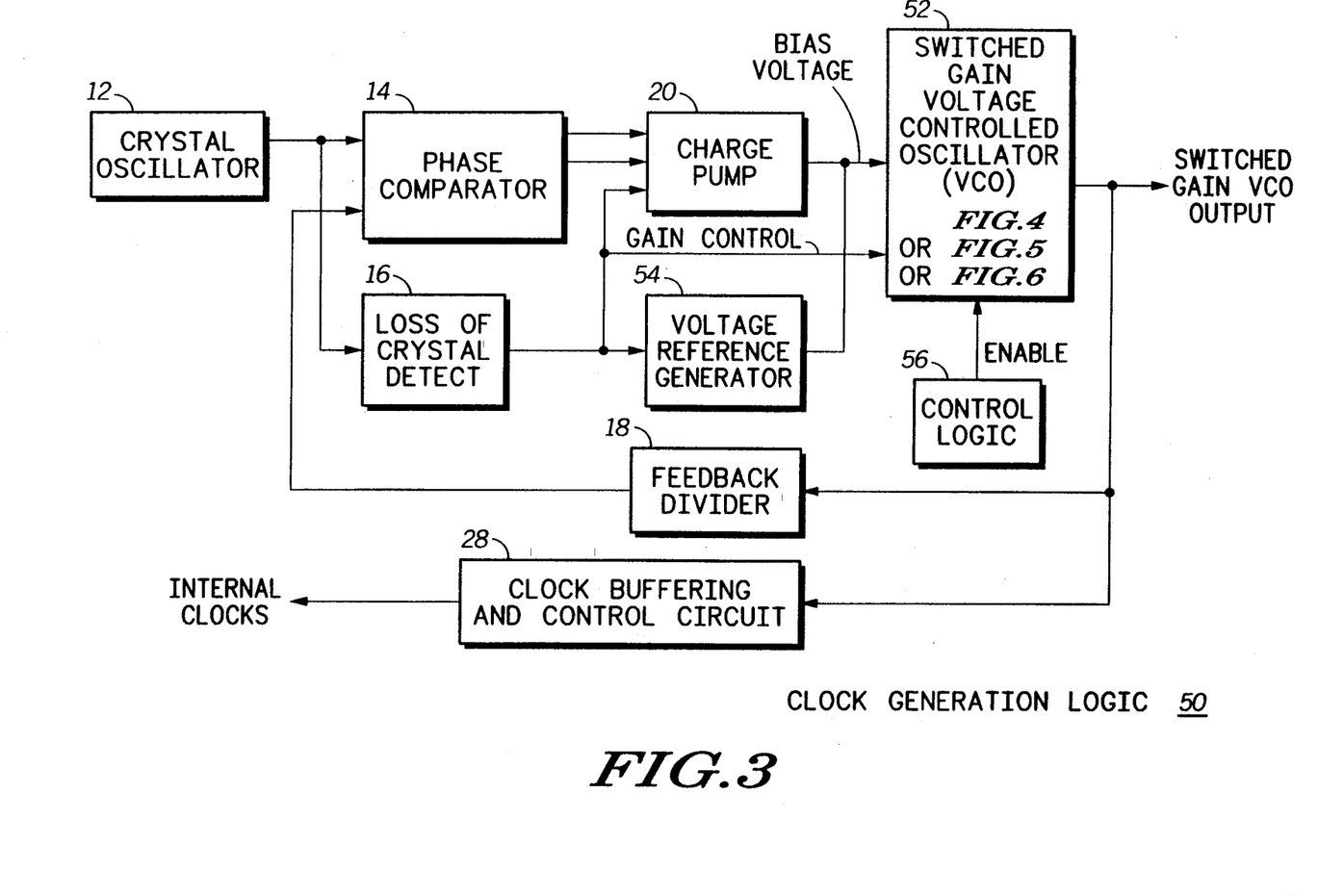
FIG. 3 illustrates, in block diagram form, a clock generation logic circuit 50 in accordance with one embodiment of the present invention.

FIG. 3 illustrates a clock generation logic circuit 50 in accordance with one embodiment of the present invention. FIG. 3 differs significantly from the prior art clock generation logic 10 in FIG. 1 in the following ways. First, the VCO 24 from FIG. 1 has been replaced by a switched gain VCO 52. Second, the voltage reference generator 22 from FIG. 1 has been replaced by a voltage reference generator 54. Third, loss of crystal detect 16 additionally provides a Gain Control signal to switched gain VCO 52. Fourth, control logic 26 has been replaced by control logic 56.

The remainder of clock generation logic circuit 50 is the same as in FIG. 1. A crystal oscillator circuit 12 provides a signal to both a phase comparator circuit 14 and a loss of crystal detect circuit 16. The phase comparator 14 also receives a signal from a feedback divider circuit 18. Phase comparator 14 provides two signals to a charge pump circuit 20. Loss of crystal detect 16 provides a signal to voltage reference generator circuit 54, to charge pump 20, and to switched gain VCO 52. Both charge pump 20 and voltage reference generator 54 are coupled to switched gain VCO 52 in order to provide a bias voltage.

Although it is not illustrated for the sake of simplicity, control logic circuit 56 is coupled to each block of circuitry illustrated in FIG. 3. However, FIG. 3 does illustrate that control logic 56 provides an Enable signal to switched gain VCO 52. Switched gain VCO 52 provides a Switched Gain VCO Output signal which is an input to a clock buffering and control circuit 28 and to feedback divider 18. Clock buffering and control circuit 28 generates clock signals called Internal Clocks which are used throughout the microcomputer to clock various circuitry.

Figure 4:
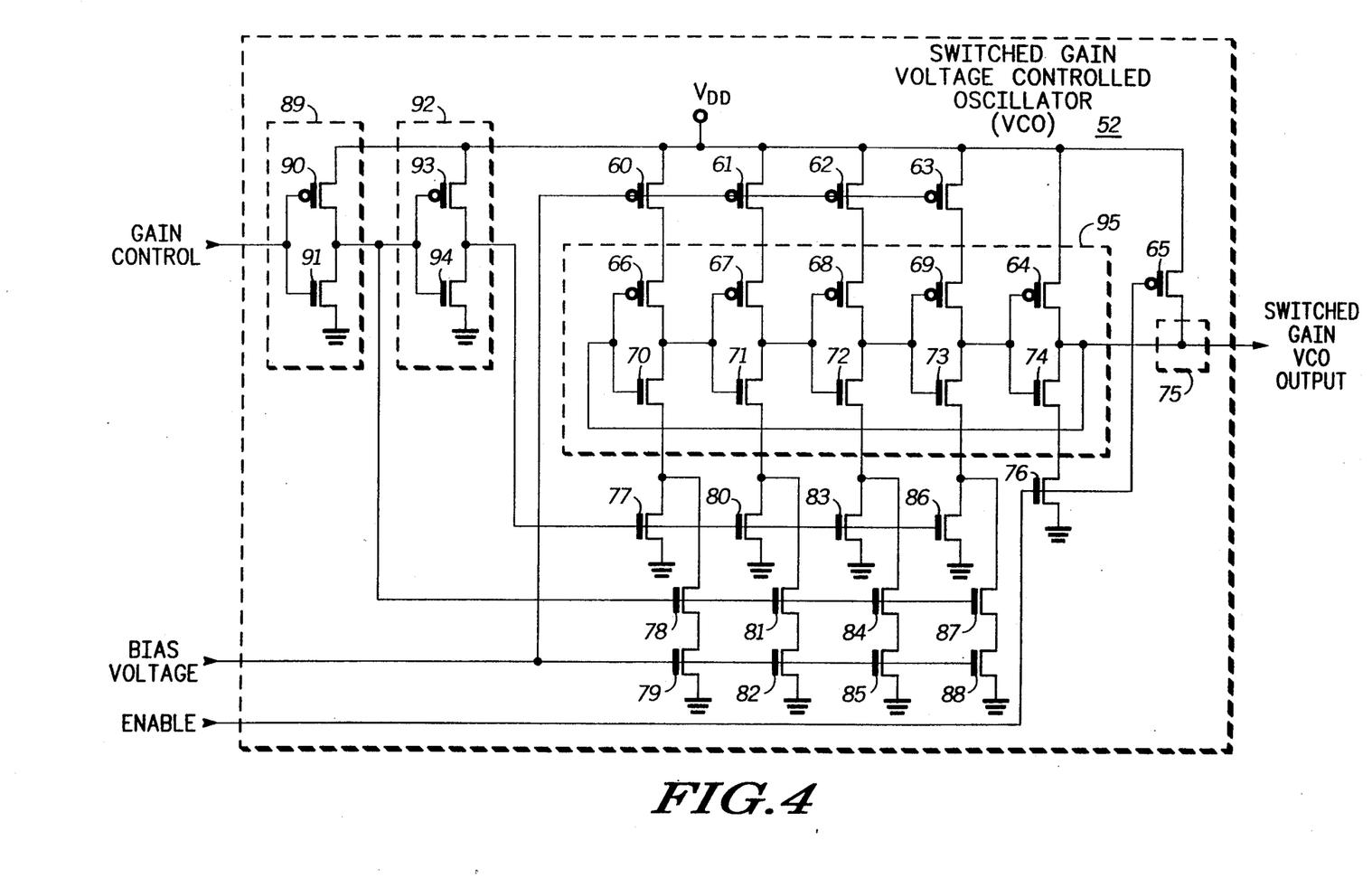
FIG. 4 illustrates, in schematic diagram form, a voltage controlled oscillator circuit 52 of FIG. 3 in accordance with one embodiment of the present invention.

FIG. 4 illustrates a switched gain voltage controlled oscillator (VCO) circuit 52 of FIG. 3 in accordance with one embodiment of the present invention. P-channel CMOS transistors 60–63 each have a first current electrode coupled to a positive power supply voltage labeled VDD, and each have a control electrode coupled to a Bias Voltage. VDD is also coupled to a first current electrode of a p-channel CMOS transistor 64 and to a first current electrode of a p-channel CMOS transistor 65.

The second current electrode of transistor 60 is coupled to a first current electrode of a p-channel CMOS transistor 66. The second current electrode of transistor 61 is coupled to a first current electrode of a p-channel CMOS transistor 67. The second current electrode of transistor 62 is coupled to a first current electrode of a p-channel CMOS transistor 68. The second current electrode of transistor 63 is coupled to a first current electrode of a p-channel CMOS transistor 69.

The second current electrode of transistor 66 is coupled to a first current electrode of an n-channel CMOS transistor 70, to a control electrode of transistor 67, and to a control electrode of an n-channel CMOS transistor 71. The second current electrode of transistor 67 is coupled to a first current electrode of transistor 71, to a control electrode of transistor 68, and to a control electrode of an n-channel CMOS transistor 72. The second current electrode of transistor 68 is coupled to a first current electrode of transistor 72, to a control electrode of transistor 69, and to a control electrode of an n-channel CMOS transistor 73. The second current electrode of transistor 69 is coupled to a first current electrode of transistor 73, to a control electrode of transistor 64, and to a control electrode of an n-channel CMOS transistor 74. The second current electrode of transistor 64 is coupled to node 75, to a first current electrode of transistor 74, to a control electrode of transistor 66, to a control electrode of transistor 70, and to a second current electrode of transistor 65.

The second current electrode of transistor 74 is coupled to a first current electrode of an n-channel CMOS transistor 76. The second current electrode of transistor 76 is coupled to ground. An Enable signal is coupled to the control electrodes of transistors 65 and 76.

The second current electrode of transistor 70 is coupled to a first current electrode of an n-channel CMOS transistor 77 and to a first current electrode of an n-channel CMOS transistor 78. The second current electrode of transistor 78 is coupled to a first current electrode of an n-channel CMOS transistor 79.

The second current electrode of transistor 71 is coupled to a first current electrode of an n-channel CMOS transistor 80 and to a first current electrode of an n-channel CMOS transistor 81. The second current electrode of transistor 81 is coupled to a first current electrode of an n-channel CMOS transistor 82.

The second current electrode of transistor 72 is coupled to a first current electrode of an n-channel CMOS transistor 83 and to a first current electrode of an n-channel CMOS transistor 84. The second current electrode of transistor 84 is coupled to a first current electrode of an n-channel CMOS transistor 85.

The second current electrode of transistor 73 is coupled to a first current electrode of an n-channel CMOS transistor 86 and to a first current electrode of an n-channel CMOS transistor 87. The second current electrode of transistor 87 is coupled to a first current electrode of an n-channel CMOS transistor 88.

The second current electrodes of transistors 77, 80, 83, 86, 79, 82, 85, and 88 are all coupled to ground. Transistors 79, 82, 85, and 88 each have a control electrode coupled to the Bias Voltage.

Inverter 89 has a p-channel CMOS transistor 90 and an n-channel CMOS transistor 91. Transistor 90 has a first current electrode coupled to VDD, and a second current electrode coupled to a first current electrode of transistor 91. The second current electrode of transistor 91 is coupled to ground. The control electrode of transistor 90 and the control electrode of transistor 91 are coupled to a Gain Control signal. Transistor 78, 81, 84, and 87 each have a control electrode coupled to the second current electrode of transistor 90.

Inverter 92 has a p-channel CMOS transistor 93 and an n-channel CMOS transistor 94. Transistor 93 has a first current electrode coupled to VDD, and a second current electrode coupled to a first current electrode of transistor 94. The second current electrode of transistor 94 is coupled to ground. The control electrode of transistor 93 and the control electrode of transistor 94 are coupled to the second current electrode of transistor 90. Transistor 77, 80, 83, and 86 each have a control electrode coupled to the second current electrode of transistor 93.

A Switched Gain VCO Output signal is provided from node 75. Ring oscillator circuit 95 has five stages. Transistors 66 and 70 form the first stage; transistors 67 and 71 form the second stage; transistors 68 and 72 form the third stage; transistors 69 and 73 form the fourth stage; and transistors 64 and 74 form the fifth stage.

Figure 5:
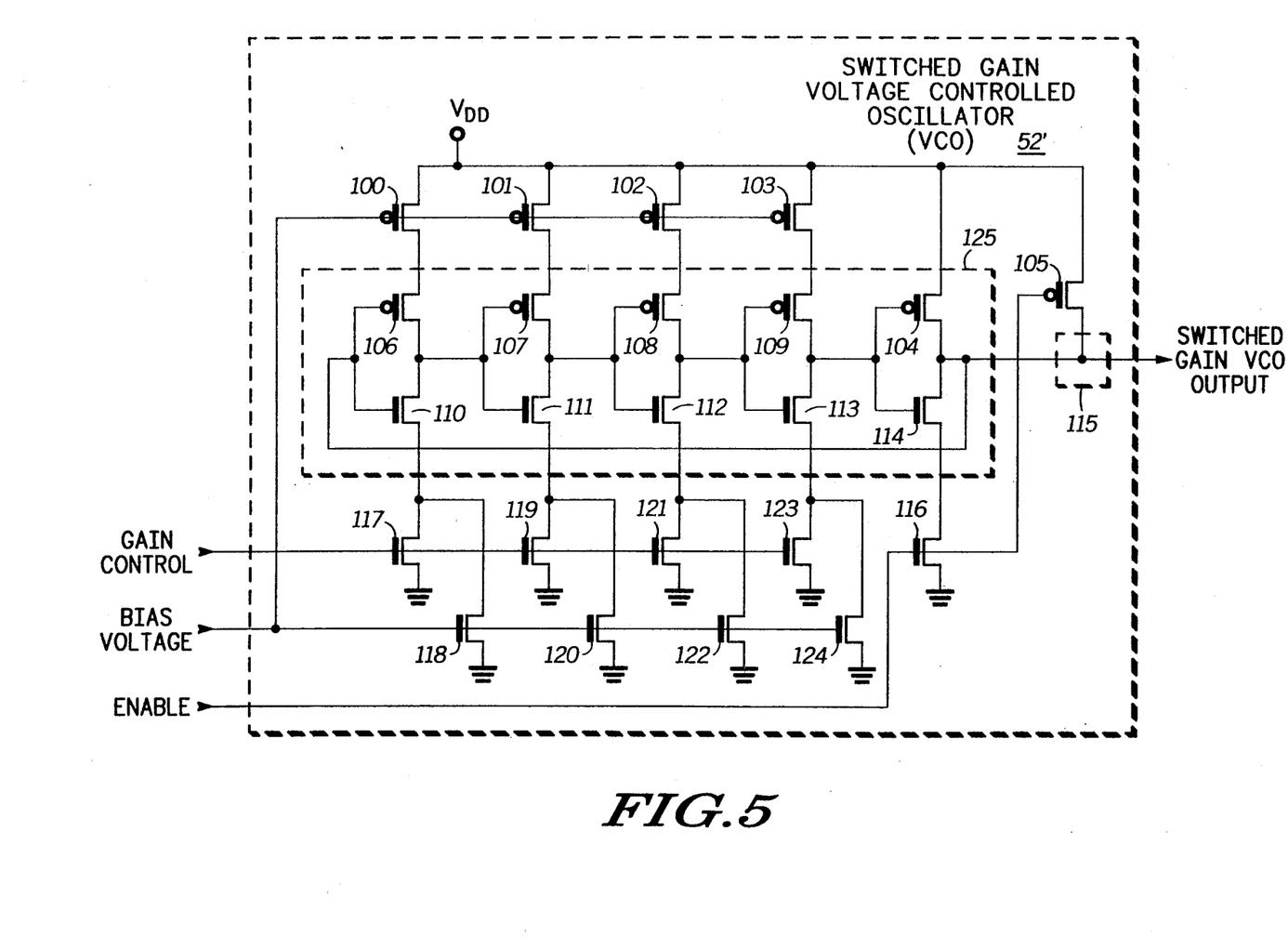
FIG. 5 illustrates, in schematic diagram form, a voltage controlled oscillator circuit 52' of FIG. 3 in accordance with one embodiment of the present invention.

FIG. 5 illustrates a switched gain voltage controlled oscillator (VCO) circuit 52' of FIG. 3 in accordance with one embodiment of the present invention. The circuit of FIG. 5 is similar to the circuit of FIG. 4 with inverters 89 and 92 removed and with transistors 78, 81, 84, and 87 removed.

P-channel CMOS transistors 100-103 each have a first current electrode coupled to a positive power supply voltage labeled VDD, and each have a control electrode coupled to a Bias Voltage. VDD is also coupled to a first current electrode of a p-channel CMOS transistor 104 and to a first current electrode of a p-channel CMOS transistor 105.

The second current electrode of transistor 100 is coupled to a first current electrode of a p-channel CMOS transistor 106. The second current electrode of transistor 101 is coupled to a first current electrode of a p-channel CMOS transistor 107. The second current electrode of transistor 102 is coupled to a first current electrode of a p-channel CMOS transistor 108. The second current electrode of transistor 103 is coupled to a first current electrode of a p-channel CMOS transistor 109.

The second current electrode of transistor 106 is coupled to a first current electrode of an n-channel CMOS transistor 110, to a control electrode of transistor 107, and to a control electrode of an n-channel CMOS transistor 111. The second current electrode of transistor 107 is coupled to a first current electrode of transistor 111, to a control electrode of transistor 108, and to a control electrode of an n-channel CMOS transistor 112. The second current electrode of transistor 108 is coupled to a first current electrode of transistor 112, to a control electrode of transistor 109, and to a control electrode of an n-channel CMOS transistor 113.

The second current electrode of transistor 109 is coupled to a first current electrode of transistor 113, to a control electrode of transistor 104, and to a control electrode of an n-channel CMOS transistor 114. The second current electrode of transistor 104 is coupled node 115, to a first current electrode of transistor 114, to a control electrode of transistor 106, to a control electrode of transistor 110, and to a second current electrode of transistor 105. The second current electrode of transistor 114 is coupled to a first current electrode of an n-channel CMOS transistor 116. An Enable signal is coupled to the control electrodes of transistors 105 and 116.

The second current electrode of transistor 110 is coupled to a first current electrode of an n-channel CMOS transistor 117 and to a first current electrode of an n-channel CMOS transistor 118. The second current electrode of transistor 111 is coupled to a first current electrode of an n-channel CMOS transistor 119 and to a first current electrode of an n-channel CMOS transistor 120. The second current electrode of transistor 112 is coupled to a first current electrode of an n-channel CMOS transistor 121 and to a first current electrode of an n-channel CMOS transistor 122. The second current electrode of transistor 113 is coupled to a first current electrode of an n-channel CMOS transistor 123 and to a first current electrode of an n-channel CMOS transistor 124.

The second current electrodes of transistors 116-124 are all coupled to ground. Transistors 118, 120, 122, and 124 each have a control electrode coupled to the Bias Voltage. Transistor 117, 119, 121, and 123 each have a control electrode coupled to a Gain Control signal.

A Switched Gain VCO Output signal is provided from node 115. Ring oscillator circuit 125 has five stages. Transistors 106 and 110 form the first stage; transistors 107 and 111 form the second stage; transistors 108 and 112 form the third stage; transistors 109 and 113 form the fourth stage; and transistors 104 and 114 form the fifth stage.

Figure 6:
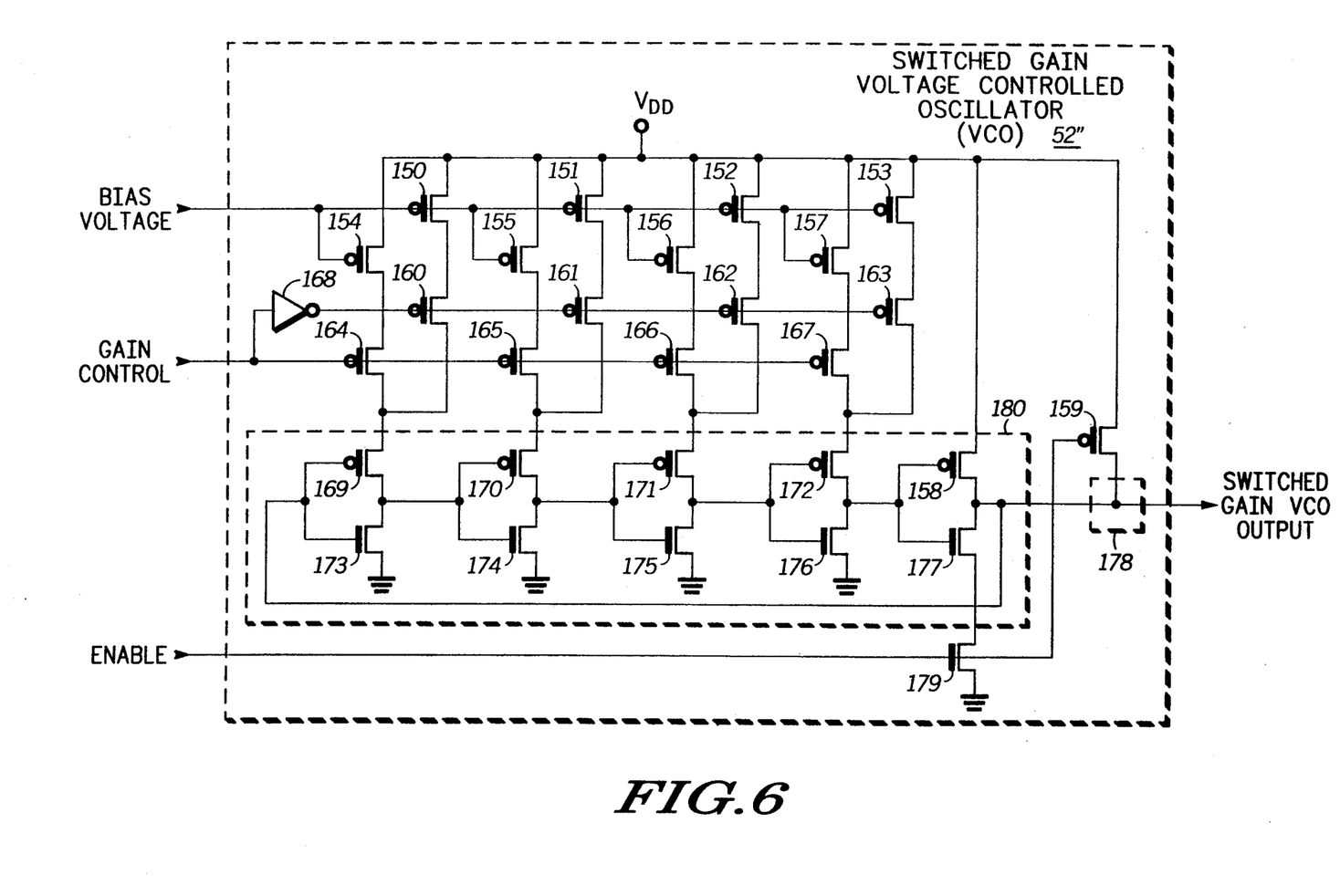
FIG. 6 illustrates, in partial schematic diagram form and partial logic diagram form, a voltage controlled oscillator circuit 52" of FIG. 3 in accordance with one embodiment of the present invention.

FIG. 6 illustrates a switched gain voltage controlled oscillator (VCO) circuit 52" of FIG. 3 in accordance with one embodiment of the present invention. P-channel CMOS transistors 150-157 each have a first current electrode coupled to a positive power supply voltage labeled VDD, and each have a control electrode coupled to a Bias Voltage. VDD is also coupled to a first current electrode of a p-channel CMOS transistor 158 and to a first current electrode of a p-channel CMOS transistor 159.

The second current electrode of transistor 150 is coupled to a first current electrode of a p-channel CMOS transistor 160. The second current electrode of transistor 151 is coupled to a first current electrode of a p-channel CMOS transistor 161. The second current electrode of transistor 152 is coupled to a first current electrode of a p-channel CMOS transistor 162. The second current electrode of transistor 153 is coupled to a first current electrode of a p-channel CMOS transistor 163. The second current electrode of transistor 154 is coupled to a first current electrode of a p-channel CMOS transistor 164. The second current electrode of transistor 155 is coupled to a first current electrode of a p-channel CMOS transistor 165. The second current electrode of transistor 156 is coupled to a first current electrode of a p-channel CMOS transistor 166. The second current electrode of transistor 157 is coupled to a first current electrode of a p-channel CMOS transistor 167.

Transistors 164-167 each have a control electrode coupled to the a Gain Control signal. An inverter 168 receives the Gain Control signal as an input. Transistors 160-163 each have a control electrode coupled to the output of inverter 168.

The second current electrode of transistor 160 and the second current electrode of transistor 164 are coupled to a first current electrode of a p-channel CMOS transistor 169. The second current electrode of transistor 161 and the second current electrode of transistor 165 are coupled to a first current electrode of a p-channel CMOS transistor 170. The second current electrode of transistor 162 and the second current electrode of transistor 166 are coupled to a first current electrode of a p-channel CMOS transistor 171. The second current electrode of transistor 163 and the second current electrode of transistor 167 are coupled to a first current electrode of a p-channel CMOS transistor 172.

The second current electrode of transistor 169 is coupled to a first current electrode of an n-channel CMOS transistor 173, to a control electrode of transistor 170, and to a control electrode of an n-channel CMOS transistor 174. The second current electrode of transistor 170 is coupled to a first current electrode of transistor 174, to a control electrode of transistor 171, and to a control electrode of an n-channel CMOS transistor 175. The second current electrode of transistor 171 is coupled to a first current electrode of transistor 175, to a control electrode of transistor 172, and to a control electrode of an n-channel CMOS transistor 176. The second current electrode of transistor 172 is coupled to a first current electrode of transistor 176, to a control electrode of transistor 158, and to a control electrode of an n-channel CMOS transistor 177.

The second current electrode of transistor 158 is coupled node 178, to a first current electrode of transistor 177, to a control electrode of transistor 169, to a control electrode of transistor 173, and to a second current electrode of transistor 159. The second current electrode of transistor 177 is coupled to a first current electrode of an n-channel CMOS transistor 179. An Enable signal is coupled to the control electrodes of transistors 159 and 179. The second current electrode of transistors 173-176 and 179 are all coupled to ground.

A Switched Gain VCO Output signal is provided from node 178. Ring oscillator circuit 180 has five stages. Transistors 169 and 173 form the first stage; transistors 170 and 174 form the second stage; transistors 171 and 175 form the third stage; transistors 172 and 176 form the fourth stage; and transistors 158 and 177 form the fifth stage.

Figure 7:
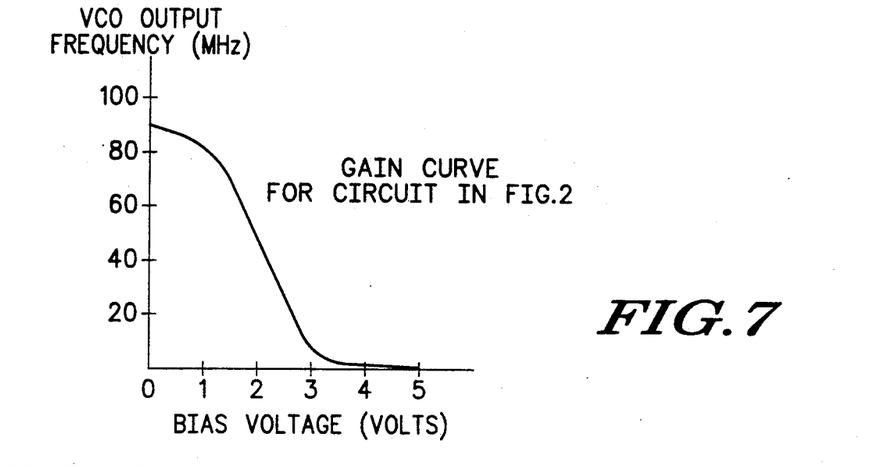
FIG. 7 illustrates, in graphical form, the single gain curve of the prior art voltage controlled oscillator circuit 24 of FIG. 2 at room temperature.

FIG. 7 illustrates the single gain curve of the prior art voltage controlled oscillator circuit 24 of FIG. 2. The gain curve is a plot of the frequency of the VCO output signal (vertical axis) versus the input bias voltage (horizontal axis). Each point on the gain curve represents the frequency of the VCO (in MHz) for a given input bias voltage (in volts).

Figure 8:
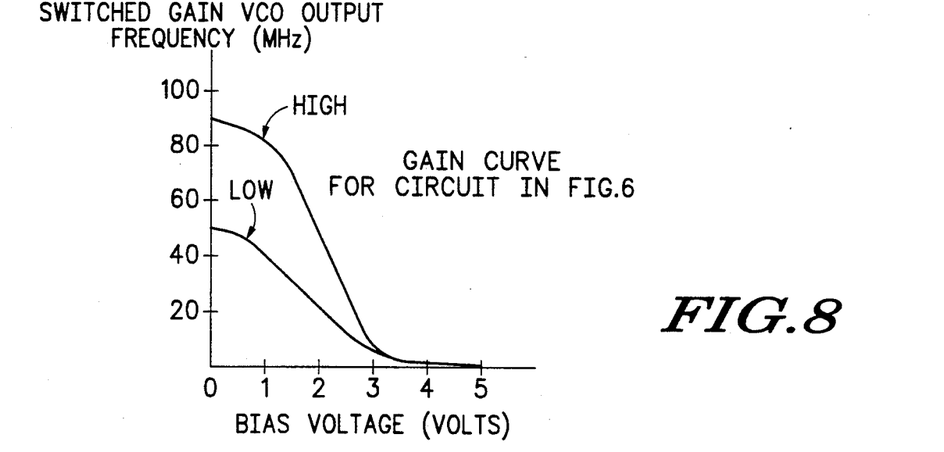
FIG. 8 illustrates, in graphical form, the two gain curves of the switched gain voltage controlled oscillator circuit 52" of FIG. 6 at room temperature.

FIG. 8 illustrates the two gain curves of the voltage controlled oscillator circuit 52" of FIG. 6. The gain curve labeled "HIGH" is the gain curve which represents the behavior of switched gain VCO 52" when the Gain Control signal has selected the high gain mode. The gain curve labeled "LOW" is the gain curve which represents the behavior of switched gain VCO 52" when the Gain Control signal has selected the low gain mode. Switched gain VCO 52" will always be in one of the two modes, either high gain mode or low gain mode. Each point on the two gain curves represents the frequency of the switched gain VCO 52" (in MHz) for a given input bias voltage (in volts).

Figure 9:
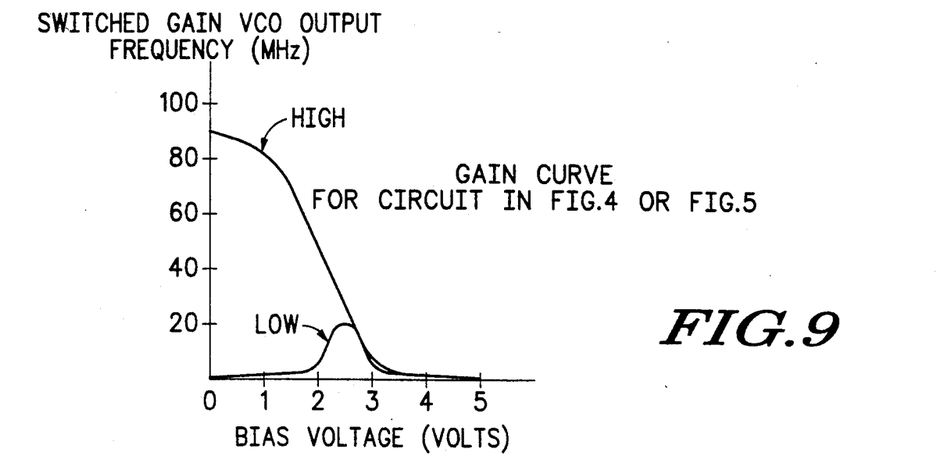
FIG. 9 illustrates, in graphical form, the two gain curves of the switched gain voltage controlled oscillator circuit 52 of FIG. 4 or the switched gain voltage controlled oscillator circuit 52' of FIG. 5 at room temperature.

FIG. 9 illustrates the two gain curves of the switched gain voltage controlled oscillator circuit 52 of FIG. 4. FIG. 9 also illustrates the two gain curves of the switched gain voltage controlled oscillator circuit 52' of FIG. 5. The voltage controlled oscillator circuit 52 of FIG. 4 and the switched gain voltage controlled oscillator circuit 52' of FIG. 5 each produce essentially the same two gain curves.

In FIG. 9, the gain curve labeled "HIGH" is the gain curve which represents the behavior of switched gain VCOs 52 and 52' when the Gain Control signal has selected the high gain mode. The gain curve labeled "LOW" is the gain curve which represents the behavior of switched gain VCOs 52 and 52' when the Gain Control signal has selected the low gain mode. Switched gain VCOs 52 and 52' will always be in one of the two modes, either high gain mode or low gain mode. Each point on the two gain curves represents the frequency of the switched gain VCOs 52 and 52' (in MHz) for a given input bias voltage (in volts).

OPERATION OF THE PREFERRED EMBODIMENTS

The terms "assert" and "negate" will be used when referring to the rendering of a signal, status bit, or similar apparatus into its logically true or logically false state, respectively. If the logically true state is a logic level one, the logically false state will be a logic level zero. And if the logically true state is a logic level zero, the logically false state will be a logic level one.

FIG. 3 illustrates a clock generation logic circuit 50 in accordance with one embodiment of the present invention. Phase comparator 14, charge pump 20, switched gain VCO 52, control logic 56, and feedback divider 18 together form a phase lock loop circuit. The feedback divider 18 forms the feedback path of the phase lock loop circuit. The phase lock loop circuit functions in the same manner as a standard phase lock loop circuit.

The purpose of the phase lock loop circuit is to make adjustments in the frequency of the VCO Output signal in order to produce a VCO Output signal that is approximately in phase with the signal from crystal oscillator 12. Phase comparator 14 receives an oscillating signal from crystal oscillator 12 and an oscillating signal from feedback divider 18. The signal provided by feedback divider 18 has been divided down to be the same frequency as the signal from crystal oscillator 12, but the signal from feedback divider 18 is approximately in phase with the VCO Output signal. Phase comparator 14 then compares the phase of the two oscillating input signals and determines whether or not to assert one of the signals it provides to charge pump 20.

The first signal from phase comparator 14 to charge pump 20 indicates that charge pump 20 should increase the potential of its output Bias Voltage. Increasing the Bias Voltage causes the VCO to decrease the frequency of the VCO Output signal. The second signal from phase comparator 14 to charge pump 20 indicates that charge pump 20 should decrease the potential of its output Bias Voltage. Decreasing the Bias Voltage causes the VCO to increase the frequency of the VCO Output signal. It is intended that only one of the two signals from phase comparator 14 should be asserted at a given time. Also, it is intended that there will be times when neither signal from phase comparator 14 is asserted.

The loss of crystal detect circuit 16 and the voltage reference generator 54 are required in order to implement the special Limp Mode. The loss of crystal detect circuit 16 detects when the signal from crystal oscillator 12 stops oscillating. In the preferred embodiment, the loss of crystal detect circuit 16 functions by using a counter (not shown) to count the transitions of one of the Internal Clock signals. Each transition of the signal from the crystal oscillator 12 is detected by the loss of crystal detect circuit 16 and is used to reset the counter (not shown). If the counter (not shown) does not detect a transition, the counter (not shown) will time out and the loss of crystal detect circuit 16 will assert the signal which it provides to the charge pump 20 and the voltage reference generator 54.

The assertion of the signal provided by the loss of crystal detect circuit 16 indicates that a loss of crystal has been detected. When this signal is asserted, the charge pump 20 disables its output and the voltage reference generator 54 enables its output. Under normal operating conditions, i.e. when the crystal oscillator is functioning properly, the signal provided by the loss of crystal detect circuit 16 is negated, and the charge pump 20 enables its output and the voltage reference generator 54 disables its output. Thus the output of charge pump 20 and the output of voltage reference generator 54 are never both enabled at the same time.

Either the charge pump 20 or the voltage reference generator 54 supplies the Bias Voltage to the switched gain VCO 52. The voltage reference generator 54 supplies the Bias Voltage to the switched gain VCO 52 only when a loss of crystal has been detected. If a loss of crystal has not been detected, the charge pump 20 supplies the Bias Voltage to the switched gain VCO 52. The low gain mode is used when the microcomputer is in special Limp Mode and the high gain mode is used when the microcomputer is in standard Phase Lock Loop Mode.

Note that in the preferred embodiment, the Bias Voltage output by voltage reference generator 54 is kept within a narrower voltage range than the Bias Voltage output by charge pump 20. In special Limp Mode and at room temperature, Bias Voltage is approximately 1.9 volts. In special Limp Mode, Bias Voltage will vary from the 1.9 volts by approximately plus or minus one volt across the full temperature range. Note that the Bias Voltage supplied by the voltage reference generator 54 varies significantly across operating voltage and manufacturing variations, as well as across temperature.

Control logic 56 provides an Enable signal to switched gain VCO 52. Although it is not illustrated for the sake of simplicity, control logic 56 is coupled to each block of circuitry illustrated in FIG. 3. The Enable signal from control logic 56 is used by switched gain VCO 52 to enable or disable the output of the Switched Gain VCO Output signal. The clock buffering and control circuit 28 receives the Switched Gain VCO Output signal and uses this signal to generate one or more Internal Clock signals. These Internal Clock signals are then used to clock various circuitry on the microcomputer.

FIG. 3 differs significantly from the prior art clock generation logic 10 in FIG. 1 in the following ways. First, the VCO 24 from FIG. 1 has been replaced by a switched gain VCO 52 which allows two different gain curves to be selected using the Gain Control signal.

Second, the voltage reference generator 22 from FIG. 1 has been replaced by a voltage reference generator 54. In the preferred embodiment, voltage reference generator 54 produces a lower potential Bias Voltage than voltage reference generator 22. In other embodiments of the present invention, voltage reference generator 54 may produce the same potential, a lower potential, or a higher potential than voltage reference generator 22.

Third, in FIG. 3, loss of crystal detect 16 additionally provides a Gain Control signal to switched gain VCO 52. In the preferred embodiment, this Gain Control signal is the same signal that loss of crystal detect circuit 16 provides to charge pump 20 and voltage reference generator 54 when a loss of crystal has been detected. In other embodiments of the present invention this control signal may come from any portion of clock generation logic 50, or even from external to clock generation logic 50.

Fourth, control logic 26 has been replaced by control logic 56. In the preferred embodiment of the present invention, control logic 56 is identical to control logic 26. However, in alternate embodiments of the present invention, control logic 56 may be different than control logic 26. In the preferred embodiment, the remainder of clock generation logic circuit 50, namely crystal oscillator 12, phase comparator 14, loss of crystal detect 16, feedback divider 18, charge pump 20, and clock buffering and control circuit 28, is the same as the remainder of clock generation logic 10 in FIG. 1. Note, however, that in other embodiments of the present invention, the circuits used for the remainder of clock generation logic circuit 50 may be different than the circuits used for the remainder of clock generation logic circuit 10.

FIG. 2 illustrates a prior art VCO 24 of FIG. 1. The single corresponding gain curve of the VCO 24 of FIG. 2 is illustrated in FIG. 7.

FIG. 4, FIG. 5, and FIG. 6 illustrate alternate embodiments of the switched gain VCO 52 of FIG. 3 in accordance with alternate embodiments of the present invention. The switched gain VCO illustrated in FIG. 4 is labeled 52. The two corresponding gain curves for switched gain VCO 52 are illustrated in FIG. 9. The switched gain VCO illustrated in FIG. 5 is labeled 52'. The two corresponding gain curves for switched gain VCO 52' are also illustrated in FIG. 9. The switched gain VCO illustrated in FIG. 6 is labeled 52''. The two corresponding gain curves for switched gain VCO 52'' are illustrated FIG. 8. Note that the two gain curves produced by switched gain VCO 52 and switched gain VCO 52' are virtually identical and thus are represented by the same two gain curves in FIG. 9.

The gain curves of FIGS. 7-9 will now be discussed. It is important to remember that gain is also a function of temperature, operating voltage, and manufacturing variations. The gain curves in FIGS. 7-9 illustrate the gain at approximately room temperature. Generally, as temperature decreases, the gain of the VCO increases. At low operating voltages, the slope of the gain curve will be more stable across temperature; but at higher operating voltages, the slope of the gain curve will vary significantly across temperature. Thus one of the worst case scenarios occurs at conditions of low temperature and high voltage.

The Bias Voltage which is output by charge pump 20 may range all the way from zero volts to the maximum operating voltage, which is 5.5 volts in the preferred embodiment. Under normal operating conditions, the Bias Voltage which is output by voltage reference generator 54 is targeted to always remain at approximately one half of the operating voltage. Any variations in the Bias Voltage output from voltage reference generator 54 are therefore due to variations in temperature, operating voltage, and manufacturing parameters.

The following table illustrates the VCO Output signal frequency (in MHz) for prior art VCO 24 in special Limp Mode across the full range of operating temperatures and voltages. The temperature range is illustrated vertically and the operating voltage range is illustrated horizontally.

| VCO Output Frequency (in MHz) | 3.0 volts | 4.5 volts | 5.0 volts | 5.5 volts |
| --- | --- | --- | --- | --- |
| 100° C. | 1.1 MHz | 6.5 MHz | 8.7 MHz | 11.1 MHz |
| 25° C. | 0.6 MHz | 7.0 MHz | 9.9 MHz | 12.9 MHz |

| VCO Output Frequency (in MHz) | 3.0 volts | 4.5 volts | 5.0 volts | 5.5 volts |
|---|---|---|---|---|
| −55° C. | 0.2 MHz | 9.9 MHz | 14.9 MHz | 19.6 MHz |

In standard Phase Lock Loop Mode, the normal maximum operating frequency of the 68300 family of microcomputers is specified to be approximately 16 MHz. This means that the circuitry of the 68300 family of microcomputers is not designed to operate using clocks that are oscillating faster than 16 MHz. At a temperature of −55 degrees Celsius and an operating voltage of 5.5 volts, the prior art VCO 24 produces a VCO Output signal frequency of approximately 19.6 MHz. 19.6 MHz is unfortunately enough higher than 16 MHz to cause the microcomputer to malfunction in some cases.

Because special Limp Mode is only used when a major system fault occurs (i.e. the loss of the crystal signal), the maximum operating frequency of the 68300 family of microcomputers in special Limp Mode is intended to be half of the normal maximum operating frequency, or approximately 8 MHz. Thus in special limp mode, the goal is to keep the VCO Output signal frequency below 8 MHz if possible, and to guarantee that the VCO Output signal frequency always remains below 16 MHz in order to prevent the microcomputer from malfunctioning. A VCO Output signal frequency of 19.6 MHz could cause a microcomputer malfunction and is therefore unacceptable. What was needed was a low gain VCO in the special Limp Mode that would be guaranteed to keep the VCO Output signal frequency below 16 MHz under all specified conditions of temperature and voltage.

The following table illustrates the Switched Gain VCO Output signal frequency (in MHz) for switched gain VCOs 52 and 52' in FIGS. 4 and 5 in special Limp Mode across the full range of operating temperatures and voltages. The temperature range is illustrated vertically and the operating voltage range is illustrated horizontally.

| Switched Gain VCO Output Frequency (in MHz) | 3.0 volts | 4.5 volts | 5.0 volts | 5.5 volts |
|---|---|---|---|---|
| 100° C. | 2.8 MHz | 6.8 MHz | 7.7 MHz | 8.5 MHz |
| 25° C. | 2.7 MHz | 8.1 MHz | 9.1 MHz | 10.1 MHz |
| −55° C. | 2.7 MHz | 10.4 MHz | 11.7 MHz | 13.1 MHz |

For the worst case, at a temperature of −55 degrees Celsius and an operating voltage of 5.5 volts, the switched gain VCOs 52 and 52' produce a Switched Gain VCO Output signal frequency of approximately 13.1 MHz. 13.1 MHz is lower than the 16 MHz normal maximum operating frequency. Thus the switched gain VCOs 52 and 52' are guaranteed to keep the Switched Gain VCO Output signal frequency below 16 MHz under all specified conditions of temperature and voltage. Therefore the microcomputer will never malfunction by exceeding the normal maximum operating frequency.

Also, using switched gain VCO 52, 52', or 52" will reduce the range of possible VCO Output signal frequencies to a narrower range. For example, at −55° C., the VCO Output Frequency for prior art VCO 24 varies across a wide range from 0.2 MHz to 19.6 MHz; whereas the Switched Gain VCO Output Frequency for switched gain VCO 52 and 52' varies across a more narrow range from 2.7 MHz to 13.1 MHz.

The switched gain VCOs 52, 52' and 52" illustrated in FIGS. 4–6 keep the special Limp Mode maximum operating frequency below 16 MHz by adding a second gain curve and by using a Gain Control signal to select which gain curve is presently being used. The term "switched gain" indicates that the circuit can switch between two or more possible gains curves. In these particular embodiments, the additional gain curve is a low gain curve and the original gain curve is a high gain curve. In alternate embodiments of the present invention, the additional gain curve could be any type of gain curve.

Referring to FIGS. 4–6, the basic differences between switched gain VCOs 52, 52' and 52" will now be discussed. The primary difference in performance between switched gain VCO 52" in FIG. 6 and switched gain VCOs 52 and 52' in FIGS. 4 and 5 is the shape of the additional low gain curve. The low gain curve in FIG. 9 has the advantage of having a lower maximum Switched Gain VCO Output frequency than the low gain curve in FIG. 8.

The primary difference between the circuitry of switched gain VCO 52" in FIG. 6 and the circuitry of switched gain VCOs 52 and 52' is that switched gain VCO 52" in FIG. 6 uses Gain Control to select between two different resistance values in the path to power (VDD), whereas switched gain VCOs 52 and 52' use Gain Control to select between two different resistance values in the path to ground. In addition, for the switched gain VCO 52" in FIG. 6, the Bias Voltage signal only goes to the p-channel side. Whereas for switched gain VCOs 52 and 52' in FIGS. 4 and 5, the Bias Voltage signal goes to both the p-channel and the n-channel sides.

There is no significant difference in performance between the switched gain VCO 52 in FIG. 4 and the switched gain VCO 52' in FIG. 5. However, there is an important difference in the amount of circuitry required. The switched gain VCO 52' in FIG. 5 produces an equivalent result with eight less transistors. The circuitry of the switched gain VCO 52' in FIG. 5 is equivalent to the circuitry of the switched gain VCO 52 in FIG. 4 with inverters 89 and 92 removed, and with transistors 78, 81, 84 and 87 removed.

Referring to FIG. 4, the operation of switched gain VCO 52 will now be discussed. As an illustration, the operation of the first stage of ring oscillator 95 and its associated transistors will be described. The first stage of ring oscillator 95 is formed by transistors 66 and 70. The first stage of ring oscillator 95 has only one path to power (VDD) through transistors 60 and 66. However, the first stage of ring oscillator 95 has two paths to ground; the first path is through transistor 77 and the second path is through transistors 78 and 79.

The Gain Control signal is used to select which path to ground will be used. When Gain Control is a logic level one, transistor 78 is non-conducting and the second path to ground is not used, but transistor 77 is fully conducting and the first path to ground is used. When Gain Control is a logic level zero, transistor 77 is non-conducting and the first path to ground is not used, but transistor 78 is fully conducting and the second path to ground is used. The first path to ground is designed to have a very low resistance value and the second path to ground is designed to have a much higher resistance value.

The resistance of a CMOS transistor is a function of the ratio of width to length (W/L) of the transistor. At a given control electrode voltage, a CMOS transistor with a low W/L ratio has a higher resistance value than a transistor with a high W/L ratio.

The resistance value in the path to ground affects the gain of switched gain VCO 52. As resistance increases, gain decreases for the following reasons. A higher resistance value in the path to ground in each stage of ring oscillator 95 increases the gate delay of each stage of ring oscillator 95. Increasing the gate delay of each stage of ring oscillator 95 means that it takes each stage longer to perform an inversion of its input signal. The gate delays of each stage are additive; that is the period of ring oscillator 95 is determined by the sum of the delays through each stage. The frequency of ring oscillator 95 is the inverse of the period (frequency=1-/period). Thus increasing the resistance in one or more stages of ring oscillator 95 will increase the overall delay and will cause the frequency of the Switched Gain VCO Output signal to decrease.

Decreasing the frequency of the Switched Gain VCO Output signal for all given input Bias Voltages produces a lower gain curve. Thus when Gain Control is a logic level zero and the higher resistance second path to ground is used, switched gain VCO 52 follows the low gain curve illustrated in FIG. 9. And when Gain Control is a logic level one and the lower resistance first path to ground is used, switched gain VCO 52 follows the high gain curve illustrated in FIG. 9. The Gain Control signal can thus be used to select between two possible VCO gain curves.

In the embodiment of the present invention illustrated in FIG. 4, a higher resistance path is added to all but the fifth and last stage of ring oscillator 95. A higher resistance path was not added to the last stage because in this embodiment, the last stage is used solely as an enable or disable control gate. The last stage of ring oscillator 95 thus either enables or disables the output of the Switched Gain VCO Output signal, depending upon the logic level of the Enable control signal.

In alternate embodiments of the present invention, a path with a higher resistance value could be added to any number of oscillator stages. The higher resistance path added to each stage could have the same resistance value, or could have a different resistance value.

Returning to the operation of the first stage of ring oscillator 95 and its associated transistors, transistors 60 and 79 are used to affect the shape of the gain curves illustrated in FIG. 9. Transistor 60 always affects the shape of the gain curve, regardless of which resistive path to ground is used. Transistor 79, on the other hand, has virtually no effect when the low resistance path to ground is selected, and thus transistor 79 only affects the shape of the low gain curve. P-channel transistor 60 and n-channel transistor 79 are used to limit the current through ring oscillator 95 at opposite voltage levels. Thus by using both p-channel transistor 60 and n-channel transistor 79, the maximum frequency of the Switched Gain VCO Output signal can be reduced for the low gain curve.

With both transistors 60 and 79 enabled, the range of possible VCO output frequencies for a given perturbation in Bias Voltage is greatly reduced. Also, with both transistors 60 and 79 enabled, the range of possible VCO output frequencies is located at lower frequencies. Consequently, in the low gain mode, the switched gain VCO 52 has an optimal Bias Voltage where the frequency of the Switched Gain VCO Output signal is at its maximum. If the Bias Voltage is either increased or decreased from its optimal value due to variations in temperature, operating voltage, or manufacturing parameters, then the frequency of the Switched Gain VCO Output signal will always decrease. Also, since the decrease in Switched Gain VCO Output signal frequency is approximately symmetrical about the optimum Bias Voltage value, the range of permissible Bias Voltages received from voltage reference generator 54 is increased.

Referring to the low gain curve in FIG. 9, when the Bias Voltage is above approximately 2.5 volts, p-channel transistor 60 is the limiting device in determining the current flow through the first stage of ring oscillator 95. As the current flow through the first stage of ring oscillator 95 decreases, the frequency of the Switched Gain VCO Output signal decreases. As the Bias Voltage increases above 2.5 volts, p-channel transistor 60 becomes less conductive and n-channel transistor 79 becomes more conductive. Note that if Bias Voltage ever reaches the pinch-off voltage of p-channel transistor 60, ring oscillator 95 will slow down to the point that it will stop oscillating. If Bias Voltage is then lowered below the pinch-off voltage of p-channel transistor 60, ring oscillator 95 will begin to oscillate again.

Still referring to the low gain curve in FIG. 9, when the Bias Voltage is below approximately 2.5 volts, n-channel transistor 79 is the limiting device in determining the current flow through the first stage of ring oscillator 95. As the current flow through the first stage of ring oscillator 95 decreases, the frequency of the Switched Gain VCO Output signal decreases. As the Bias Voltage decreases below 2.5 volts, n-channel transistor 79 becomes less conductive and p-channel transistor 60 becomes more conductive. Note that if Bias Voltage ever reaches the pinch-off voltage of n-channel transistor 79, ring oscillator 95 will slow down to the point that it will stop oscillating. If Bias Voltage is then raised above the pinch-off voltage of n-channel transistor 79, ring oscillator 95 will begin to oscillate again.

The operation of the second, third, and fourth stages of ring oscillator 95 and their associated transistors, is the same as the operation of the first stage described above.

Referring to FIG. 5, the operation of switched gain VCO 52' will now be discussed. As was previously stated, there is no significant difference in performance between the switched gain VCO 52 in FIG. 4 and the switched gain VCO 52' in FIG. 5. Switched gain VCOs 52 and 52' each produce the two gain curves illustrated in FIG. 9.

However, there is an important difference in the amount of circuitry required in FIG. 4 and in FIG. 5. The switched gain VCO 52' in FIG. 5 produces an equivalent result with eight less transistors. The circuitry of the switched gain VCO 52' in FIG. 5 is equivalent to the circuitry of the switched gain VCO 52 in FIG. 4 with inverters 89 and 92 removed, and with transistors 78, 81, 84 and 87 removed. In FIG. 5, the low resistance paths to ground are through transistors 117, 119, 121, and 123, and the higher resistance paths to ground are through transistor 118, 120, 122, and 124. Switched gain VCO 52' in FIG. 5 operates in the same manner as was described above for switched gain VCO 52 in FIG. 4.

Referring to FIG. 6, the operation of switched gain VCO 52" will now be discussed. The primary difference in performance between switched gain VCO 52" in FIG. 6 and switched gain VCOs 52 and 52' in FIGS. 4 and 5 is the shape of the additional low gain curve. The low gain curve in FIG. 8 has a different shape than the low gain curve in FIG. 9.

The primary difference between the circuitry of switched gain VCO 52" in FIG. 6 and the circuitry of switched gain VCOs 52 and 52' is that switched gain VCO 52" in FIG. 6 uses Gain Control to select between two different resistance values in the path to power (VDD), whereas switched gain VCOs 52 and 52' use Gain Control to select between two different resistance values in the path to ground. In addition, for the switched gain VCO 52" in FIG. 6, the Bias Voltage signal only goes to the p-channel side. Whereas for switched gain VCOs 52 and 52' in FIGS. 4 and 5, the Bias Voltage signal goes to both the p-channel and the n-channel sides.

The Gain Control signal in switched gain VCO 52" is used to select which paths to power (VDD) will be used. When Gain Control is a logic level one, transistors 164-167 are non-conducting and the higher resistance paths to power (VDD) are not used, but transistors 160-163 are fully conducting and the low resistance paths to power (VDD) are used. When Gain Control is a logic level zero, transistors 160-163 are non-conducting and the low resistance paths to power (VDD) are not used, but transistors 164-167 are fully conducting and the higher resistance paths to power (VDD) are used.

Thus, transistors 150-157 are used to affect the shape of the gain curves illustrated in FIG. 8 by changing the resistance in the paths to power (VDD). Transistors 150-153 only affect the shape of the high gain curve. Transistors 154-157 only affect the shape of the low gain curve.

At a given control electrode voltage, a CMOS transistor with a low W/L ratio has a higher resistance value than a transistor with a high W/L ratio. The high resistance paths to power (VDD) have a high resistance due to the fact that transistors 154-157 have a low ratio of width to length (W/L). The low resistance paths to power (VDD) have a low resistance due to the fact that transistors 150-153 have a high ratio of width to length (W/L).

The resistance value in the paths to power (VDD) affects the gain of switched gain VCO 52". As resistance increases, gain decreases for the following reasons. A higher resistance value in the path to power (VDD) in each stage of ring oscillator 180 increases the gate delay of each stage of ring oscillator 180. Increasing the gate delay of each stage of ring oscillator 180 means that it takes each stage longer to perform an inversion of its input signal. The gate delays of each stage are additive; that is the period of ring oscillator 180 is determined by the sum of the delays through each stage. The frequency of ring oscillator 180 is the inverse of the period (frequency = 1/period). Thus increasing the resistance in one or more stages of ring oscillator 180 will increase the overall delay and will cause the frequency of the Switched Gain VCO Output signal to decrease.

Decreasing the frequency of the Switched Gain VCO Output signal for all given input Bias Voltages produces a lower gain curve. Thus when Gain Control is a logic level zero and the higher resistance paths to power (VDD) are used, switched gain VCO 52" follows the low gain curve illustrated in FIG. 8. And when Gain Control is a logic level one and the low resistance paths to power (VDD) are used, switched gain VCO 52" follows the high gain curve illustrated in FIG. 8. The Gain Control signal can thus be used to select between two possible VCO gain curves.

In the embodiment of the present invention illustrated in FIG. 6, a higher resistance path is added to all but the fifth and last stage of ring oscillator 180. A higher resistance path was not added to the last stage because in this embodiment, the last stage is used solely as an enable or disable control gate. The last stage of ring oscillator 180 thus either enables or disables the output of the Switched Gain VCO Output signal, depending upon the logic level of the Enable control signal.

In alternate embodiments of the present invention, a path with a higher resistance value could be added to any number of oscillator stages. The higher resistance path added to each stage could have the same resistance value, or could have a different resistance value.

SUMMARY AND SOME ALTERNATE EMBODIMENTS

In summation, the above specification describes a method and apparatus for switching between gain curves of a switched gain voltage controlled oscillator (VCO) 52, 52' or 52". By adding paths to power or ground with a different resistance value, the present invention provides a switched gain VCO 52, 52' or 52" which has two possible gain curves.

A control signal, Gain Control, is used by the switched gain VCO 52, 52' or 52" to determine which resistive path, and thus which gain curve, is to be used. In the preferred embodiment, the first resistive path has a low resistance value, which results in a high gain curve which is used in the standard Phase Lock Loop Mode. The second resistive path has a high resistance value, which results in a low gain curve which is used in the special Limp Mode. The second resistance value can be chosen in order to ensure that the gain of the switched gain VCO 52, 52' or 52" is always low enough for the microcomputer to continue to function properly across the entire specified ranges of temperature and voltage.

The present invention thus allows the switched gain VCO 52, 52' or 52" to be optimized for both high gain Phase Lock Loop Mode and low gain special Limp Mode. In addition, the present invention could be used for other microcomputer modes which require a different shaped VCO gain curve.

In alternate embodiments of the present invention, a capacitive value could be used instead of or in addition to the disclosed resistive value in order to change the shape of the gain curve. It is well known in the art that the delay through each stage of a ring oscillator is a function of the RC (resistive-capacitive) time constant. Therefore, altering either the resistance or the capacitance or altering both the resistance and the capacitance within one or more stages or ring oscillator 47 can be used to affect the shape of the gain curve.

While the present invention has been illustrated and described with reference to specific embodiments, further modifications and improvements will occur to those skilled in the art. For example, in alternate embodiments of the present invention, a path with a higher resistance value could be added to any number of oscillator stages. The higher resistance path added to each stage could have the same resistance value, or could have a different resistance value. In alternate embodiments of the present invention, a path with a lower resistance value could be added to any number of oscillator stages. The lower resistance path added to each stage could have the same resistance value, or could have a different resistance value.

In alternate embodiments of the present invention, multiple Gain Control signals could be used and any number of paths with a different resistance value could be added to one or more oscillator stages. The multiple Gain Control signals could be used to select which path, and thus which gain curve, is to be used presently. In alternate embodiments, it would also be possible to concurrently select multiple resistive paths so that the overall effective resistance is due to multiple resistance values in parallel.

In alternate embodiments of the present invention, any type of resistive elements, either active or passive, such as simple resistors, could be used in FIG. 4 in place of transistors 79, 82, 85, and 88, in FIG. 5 in place of transistors 118, 120, 122, and 124, and in FIG. 6 in place of transistors 150–157. Any appropriate resistance values could be used. In alternate embodiment of the present invention, an additional resistive path could be either a path to power or a path to ground.

Another embodiment of the present invention may be similar to the circuit illustrated in FIG. 6 with inverter 168 removed and replaced with a conductor, and with transistors 164–167 removed and replaced with conductors.

It is to be understood, therefore, that this invention is not limited to the particular forms illustrated and that it is intended in the appended claims to cover all modifications that do not depart from the spirit and scope of this invention.

We claim:
1. A voltage controlled oscillator circuit, comprising:
 a ring oscillator;
 first gain curve means, coupled to said ring oscillator, for causing said ring oscillator to have a first gain curve;
 second gain curve means, coupled to said ring oscillator, for causing said ring oscillator to have a second gain curve; and
 a gain control signal, coupled to said first gain curve means, said gain control signal enabling said first gain curve means when said gain control signal is in a first logic state, and said gain control signal enabling said second gain curve means when said gain control signal is in a second logic state.

2. A circuit as in claim 1, further comprising:
 a detect circuit, coupled to said first gain curve means, said detect circuit providing said gain control signal.

3. A circuit as in claim 1, wherein a maximum frequency of the second gain curve occurs at a bias voltage value between a predetermined minimum bias voltage and a predetermined maximum bias voltage.

4. A circuit as in claim 1, further comprising:
 means for providing an output signal, said means for providing the output signal being coupled to said ring oscillator; and
 an enable signal, coupled to said means for providing the output signal, said enable signal enabling said means for providing the output signal when said enable signal is in a first logic state, and said enable signal disabling said means for providing the output signal when said enable signal is in a second logic state.

5. A circuit as in claim 1, further comprising:
 a bias voltage signal, coupled to said second gain curve means, said bias voltage signal affecting a resistance value of said second gain curve means.

6. A circuit as in claim 1, wherein said first gain curve means further comprises:
 a first resistive element having a first current electrode coupled to said ring oscillator and having a second current electrode.

7. A circuit as in claim 6, wherein the second current electrode of said first resistive element is coupled to ground.

8. A circuit as in claim 6, wherein said first resistive element is a transistor.

9. A circuit as in claim 7, wherein said second gain curve means further comprises:
 a second resistive element having a first current electrode coupled to said ring oscillator and having a second current electrode coupled to ground.

10. A circuit as in claim 9, wherein said first resistive element is a transistor and said second resistive element is a transistor.

11. A method for switching between gain curves of a voltage controlled oscillator circuit, the method comprising the steps of:
 providing a first resistance value in the voltage controlled oscillator circuit;
 providing a second resistance value in the voltage controlled oscillator circuit;
 asserting a gain control signal when the loss of an input signal is detected;
 using the first resistance value when the gain control signal is asserted;
 using the second resistance value when the gain control signal is negated;
 generating an output signal having a first gain curve when the first resistance value is used; and
 generating the output signal having a second gain curve when the second resistance value is used.

12. A method as in claim 11, the method further comprising the step of:
 providing a bias voltage to the voltage controlled oscillator circuit.

13. A method as in claim 11, the method further comprising the step of:
 providing the output signal external to the voltage controlled oscillator circuit when an enable signal is asserted.

14. A voltage controlled oscillator circuit, comprising:
 a first oscillator stage, comprising:
  a first transistor having a first current electrode coupled to a first power supply voltage level, having a second current electrode, and having a control electrode;
  a second transistor having a first current electrode coupled to the second current electrode of the first transistor, and having a second current electrode;
  a third transistor having a first current electrode coupled to the second current electrode of the second transistor, and having a second current electrode;

a fourth transistor having a first current electrode coupled to the second current electrode of the third transistor, having a second current electrode coupled to a second power supply voltage level, and having a control electrode;
a fifth transistor having a first current electrode coupled to the first current electrode of said fourth transistor, and having a control electrode;
a gain control signal coupled to the control electrode of said fourth transistor; and
a bias voltage coupled to the control electrode of said fifth transistor and coupled to the control electrode of said first transistor.

15. A circuit as in claim 14, wherein said gain control signal selects a first gain curve when said gain control signal is in a first logic state, and said gain control signal selects a second gain curve when said gain control signal is in a second logic state.

16. A circuit as in claim 14, wherein said first transistor is a p-channel field effect transistor, said second transistor is a p-channel field effect transistor, said third transistor is an n-channel field effect transistor, said fourth transistor is an n-channel field effect transistor, and said fifth transistor is an n-channel field effect transistor.

17. A circuit as in claim 14, further comprising:
a second oscillator stage coupled to said first oscillator stage.

18. A circuit as in claim 17, wherein said second oscillator stage is identical to said first oscillator stage.

19. A circuit as in claim 17, further comprising:
a third oscillator stage coupled to said second oscillator stage, for receiving an enable signal and for providing an oscillating output signal when the enable signal is in a first logic state.

20. A circuit as in claim 19, wherein said third oscillator stage is coupled to said first oscillator stage through a feedback path.

* * * * *